United States Patent
Barney et al.

(10) Patent No.: US 6,560,753 B2
(45) Date of Patent: *May 6, 2003

(54) INTEGRATED CIRCUIT HAVING TAP CELLS AND A METHOD FOR POSITIONING TAP CELLS IN AN INTEGRATED CIRCUIT

(75) Inventors: Clive Alva Barney, Fort Collins, CO (US); Scott Ryan Grange, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 110 days.

This patent is subject to a terminal disclaimer.

(21) Appl. No.: 09/779,036

(22) Filed: Feb. 7, 2001

(65) Prior Publication Data

US 2002/0105049 A1 Aug. 8, 2002

(51) Int. Cl.[7] .............................................. G06F 17/50
(52) U.S. Cl. ...................... 716/2; 716/8; 716/9; 716/10
(58) Field of Search ................................ 716/2, 7, 8, 9, 716/10

(56) References Cited

U.S. PATENT DOCUMENTS 5,987,086 A * 11/1999 Raman et al. .................. 716/1

* cited by examiner

Primary Examiner—Vuthe Siek
Assistant Examiner—Brandon Bowers

(57) ABSTRACT

An integrated circuit includes a set of standard cells, referred to as tap cells, each having a well tap and a substrate tap for coupling a well region and a substrate region to a power source and ground, respectively. The tap cells are disposed at intervals that do not exceed a maximum allowable distance as specified by a set of design rules associated with the integrated circuit. A method for designing the integrated circuit includes determining the positions at which the tap cells will be fixed and creating a design layout for the integrated circuit using a place and route tool that incorporates the positions.

18 Claims, 4 Drawing Sheets

INTEGRATED CIRCUIT HAVING TAP CELLS AND A METHOD FOR POSITIONING TAP CELLS IN AN INTEGRATED CIRCUIT

The present invention generally relates to integrated circuits, and more particularly, to an integrated circuit having tap cells located at equally spaced intervals and to a method for positioning tap cells at equally spaced intervals in an integrated circuit.

Undesired bipolar transistors are inherently formed in integrated circuits that are manufactured using conventional integrated circuit manufacturing techniques. These undesired bipolar transistors may cause the integrated circuit to have robustness problems including, for example, a phenomenon known as latch-up. Latch-up occurs when the undesired bipolar transistors in combination with desired transistors create a positive feedback circuit in which the current flowing through the circuit increases to a magnitude that exceeds the current capacity of the integrated circuit. The excess current causes the integrated circuit to become defective and thus, unusable.

As is well known in the art, latch-up is prevented by placing well taps and substrate taps at positions in the integrated circuit that are located appropriate distances from one another. Each well tap is an electrically conductive lead that couples a well region of the integrated circuit to a power source and each substrate tap is an electrically conductive lead that couples a substrate region of the integrated circuit to ground. Coupling the well and substrate regions to power and ground, respectively, reduces the substrate resistance, thus causing the positive feedback to be removed.

In particular, the taps must be positioned so that the distance between any two well taps and any two substrate taps does not exceed a maximum allowable distance that is obtained using a set of design rules associated with the integrated circuit. As will be understood by one having ordinary skill in the art, the design rules typically specify that the distance from any point in either the substrate or well regions must not be located farther than a maximum distance from the nearest substrate tap or well tap, respectively. Thus, the maximum allowable distance specified in the design rules is not defined as being equal to the maximum allowable distance as that term is used for purposes of this discussion, i.e., the maximum allowable distance between tap cells. Rather, the maximum allowable distance between tap cells is equal to the maximum distance specified in the design rules multiplied by a factor of two. As is well known in the art of integrated circuit design, the design rules may also specify various other physical parameters necessary for the proper construction of the integrated circuit such as, for example, the minimum allowable distance between wires or conducting paths disposed in the integrated circuit and the minimum allowable width of such wires.

Currently, methods for positioning well and substrate taps in an integrated circuit are performed during the circuit design process which begins with defining the desired functions or computing tasks to be performed by the integrated circuit. These functions, once defined, are described in a hardware description language that is then translated by hand or using a computerized synthesis tool, into a netlist. As will be understood by one having ordinary skill in the art, a netlist defines a set of logic gates and the connectivity between the logic gates needed to implement the functions described in the hardware description language. For example, the netlist may include a list of the logic gates, wires and input/output ports needed to implement the integrated circuit. After the netlist has been created, the integrated circuit designer provides the netlist and a floorplan as data input to a computerized "place and route" tool that creates a layout associated with netlist. The floorplan specifies various physical constraints associated with the integrated circuit design including, for example, the location of the power grid, the locations of input and output ports and the locations where the various wires or conducting paths will be located. The "place and route" tool uses the netlist and floorplan to determine the physical design of the integrated circuit from which the integrated circuit will ultimately be fabricated. Each logic gate is represented in the netlist by a logic cell and thus, the resulting layout is comprised of a set of logic cells that, when formed in the integrated circuit, will implement the logic dictated by the corresponding logic gates. To reduce the time required to perform the design process, cell libraries have been created wherein standard cell designs are available. Of course, there are applications that may require one or more specialized cells in which case the designer will either create a custom cell for the layout or alter a library cell in a manner required by the desired design. Once complete, the resulting layout is used to manufacture the desired integrated circuit.

Two well-known methods for positioning taps in an integrated circuit occur at different stages of the circuit design process. In a first tap positioning method, the positions of the taps were determined by virtue of using a standard cell library for cell selection. More particularly, each standard cell, also referred to as a library cell, was designed to include at least one well tap and one substrate tap. Thus, when the "place and route" tool used the netlist to extract standard library cells to use for the layout, the tap locations were defined in the resulting layout by default. This technique of placing at least one of each type of tap per library cell was effective for earlier-generation integrated circuits because earlier integrated circuits and the cells associated with these integrated circuits were physically larger than the integrated circuits of today. More particularly, at least one well tap and one substrate tap had to be placed in each library cell to satisfy the design rule related to the maximum allowable distance between taps. In some instances, the dimensions of a cell must be increased in order to fit the taps thereby causing an undesired increase in the size of the integrated circuit.

In a second tap positioning method, a layout was prepared using cells that are not designed to include taps and then proper locations for the taps were determined by engineers. Although this second method yielded the optimal result for layout density, it was extremely costly in terms of engineering hours. Using this method, an engineer determined appropriate locations for a set of taps and then used a design rule checker to determine whether the taps were indeed appropriately positioned, i.e., are in compliance with the design rules. As is well known in the art, a design rule checker is a computer-aided design tool that determines whether the resulting layout complies with the design rules associated with the integrated circuit. These steps were then repeated in an iterative fashion until the resulting measurements indicated that the tap locations had been properly positioned. Unfortunately, the iterative and manual nature of the process caused it to be a time consuming and thus costly task.

However, due to continuing developments in the design and manufacture of integrated circuits, cell dimensions are shrinking. As a result, a well tap and a substrate tap are no longer required in each cell and the engineering hours spent positioning taps in library cells are needlessly spent. Moreover, the positioning of unnecessary taps needlessly consumes the area of the cell that may otherwise be available for other cell circuitry and further consumes the area available for wires in the cell.

SUMMARY OF THE INVENTION

The present invention is directed to an integrated circuit having standard cells that contain well and substrate taps and that are located at equally spaced intervals that do not exceed a maximum allowable distance. The tap cells each include a well tap and a substrate tap and are positioned at generally equally spaced intervals to prevent the formation of positive feedback circuits which may cause latch-up. A method for designing an integrated circuit having tap cells located at generally equally spaced intervals includes determining a set of positions at which the tap cells are to be located and then creating a layout for the integrated circuit that incorporates the positions.

DETAILED DESCRIPTION

Figure 1A:
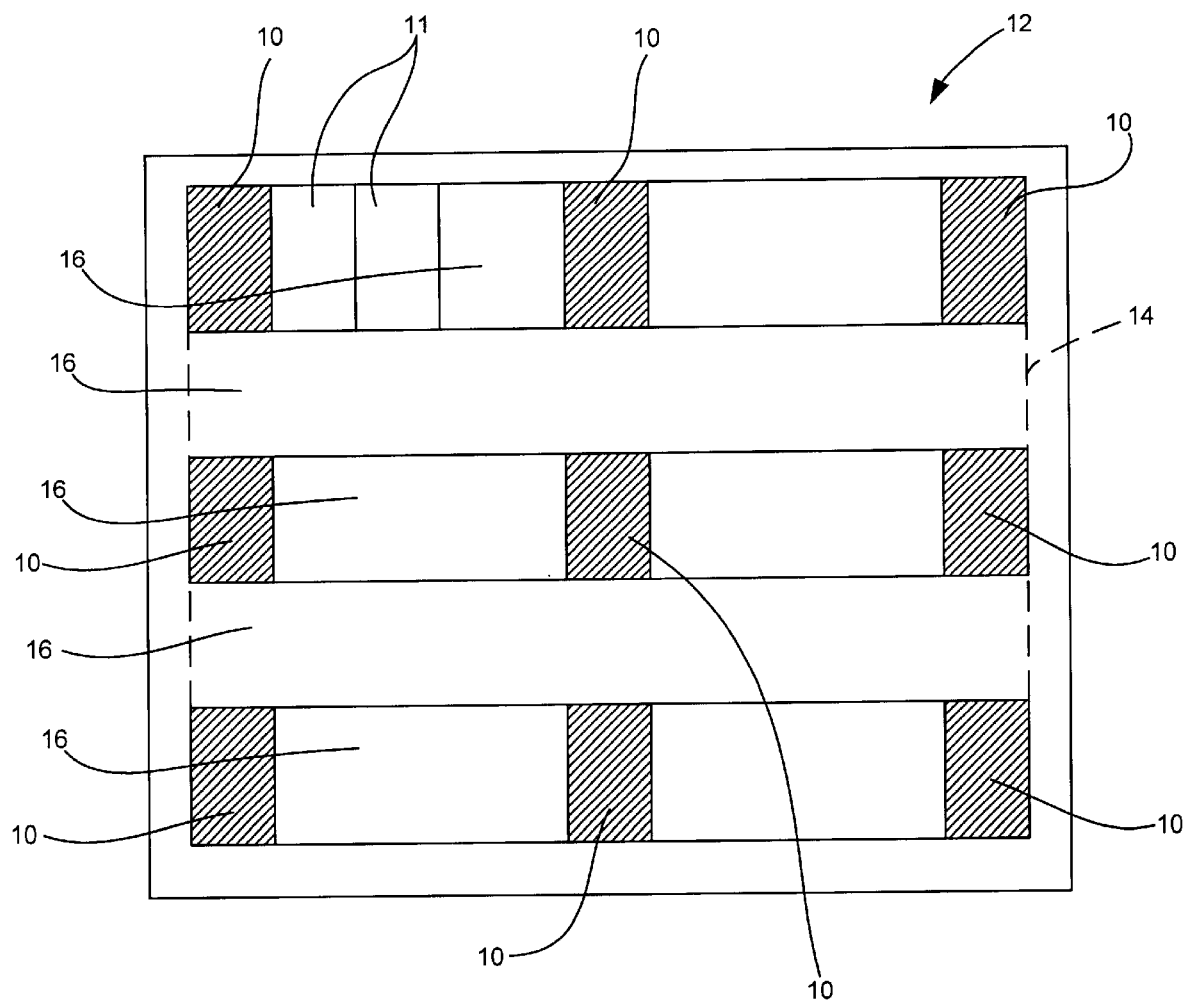
FIG. 1A is a plan view of an integrated circuit having tap cells positioned in accordance with the present invention.

Referring now to FIG. 1A, an integrated circuit having a set of tap cells 10 positioned in accordance with the present invention is indicated generally at 12. The integrated circuit 12 includes a placeable area 14 in which logic cells 11 and wiring (not shown) may be placed and that is partitioned into a set of rows 16 of equal height. The height of each row 16 is also equal to the height of a standard library cell, and thus, each row 16 is dimensioned to support a plurality of standard library cells 11. The width of each standard library cell 11 may vary, and as a result, the number of standard library cells disposed in any given row 16 will vary depending on the widths of the cells disposed therein.

Figure 1B:
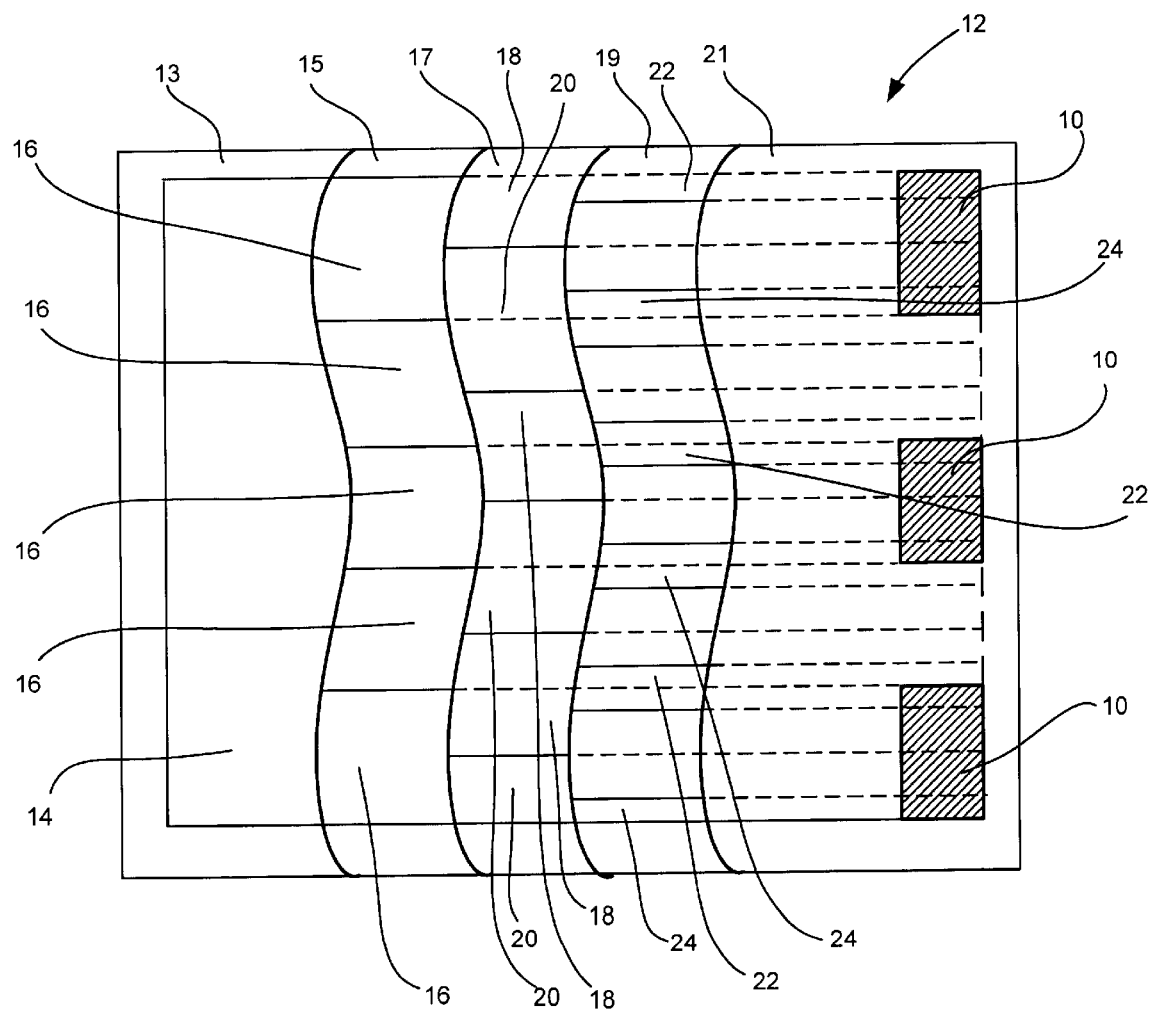
FIG. 1B is a plan view of the integrated circuit of FIG. 1A with portions of a set of layers of the integrated circuit removed to show features associated with the layers.

As will be appreciated by one having ordinary skill in the art, integrated circuits 12 are constructed by forming layers comprised of a semiconductor material, such as silicon, an insulating material and a metal. For illustrative purposes, the detail associated with various layers of the integrated circuit 12 are represented in the sectionalized view of FIG. 1B. Specifically, the placeable area 14, which extends through all layers of the integrated circuit, is shown in a section 13 of FIG. 1B. In addition, the rows 16 of the integrated circuit 12 are associated with all layers of the integrated circuit and are shown in a section 15 of FIG. 1B. In a section 17, layers of the integrated circuit 12 having a set of well regions 18 and substrate regions 20 are shown. In particular, each row 16 of the integrated circuit 12 includes a well region 18 and a substrate region 20. The well and substrate regions 18 and 20 are formed by a process, referred to as doping, which is performed by adding impurities to the various layers of silicon. Adding impurities causes the electrical qualities of the silicon to change such that the silicon becomes either more or less electrically conductive depending on the type of material added. More specifically, the substrate region 20 is formed using a layer of silicon that spans the entire placeable area 14 and that may be doped with, for example, a P-type dopant and the well regions 18 are formed by adding a layer of N-type dopant on top of select areas of the layer that forms the substrate region 20. Thus, the well regions 18 are defined as the select areas that are doped with the N-type dopant and the substrate regions 20 are, by default, the portions of the placeable area 14 that are not occupied by well regions 18. The well regions 18 and substrate regions 20 are positioned so that each row 16, except the first and last rows, shares a well region 18 with an adjacent row 16 and each row 16 shares a substrate region 20 with an adjacent row 16. A section 19, shows a layer of the integrated circuit 12 at which at set of power rails 22 and a set of ground rails 24 are disposed. The power and ground rails 22, 24 span the width of the placeable area 14 and are positioned so that each power rail 22, except for the power rail 22 disposed in the top row 16, straddles two adjacent rows 16 and each ground rail 24, except the ground rail 24 disposed in the bottom row 16, straddles two adjacent rows 16. The ground rail 24 is connected to ground potential and the power rail 22 is coupled to a power source. In a section 21, the position of the tap cells 10 relative to the rows 16, the well and substrate regions 18, 20 and the power and ground rails 22, 24 is shown. Of course, integrated circuits may be configured in any number of ways and the configuration of the integrated circuit 12 of FIGS. 1A and 1B is merely intended to be representative of a typical integrated circuit design. For example, the power and ground rails 22 and 24, which are shown as being disposed in the same layer of the integrated circuit 12, may be disposed in any layer of the integrated circuit 12 and both rails 22 and 24 need not be disposed in the same layer of the integrated circuit 12. Likewise, the features associated with the other layers of the integrated circuit 12 may be reconfigured in any of a number of possible ways.

Figure 2:
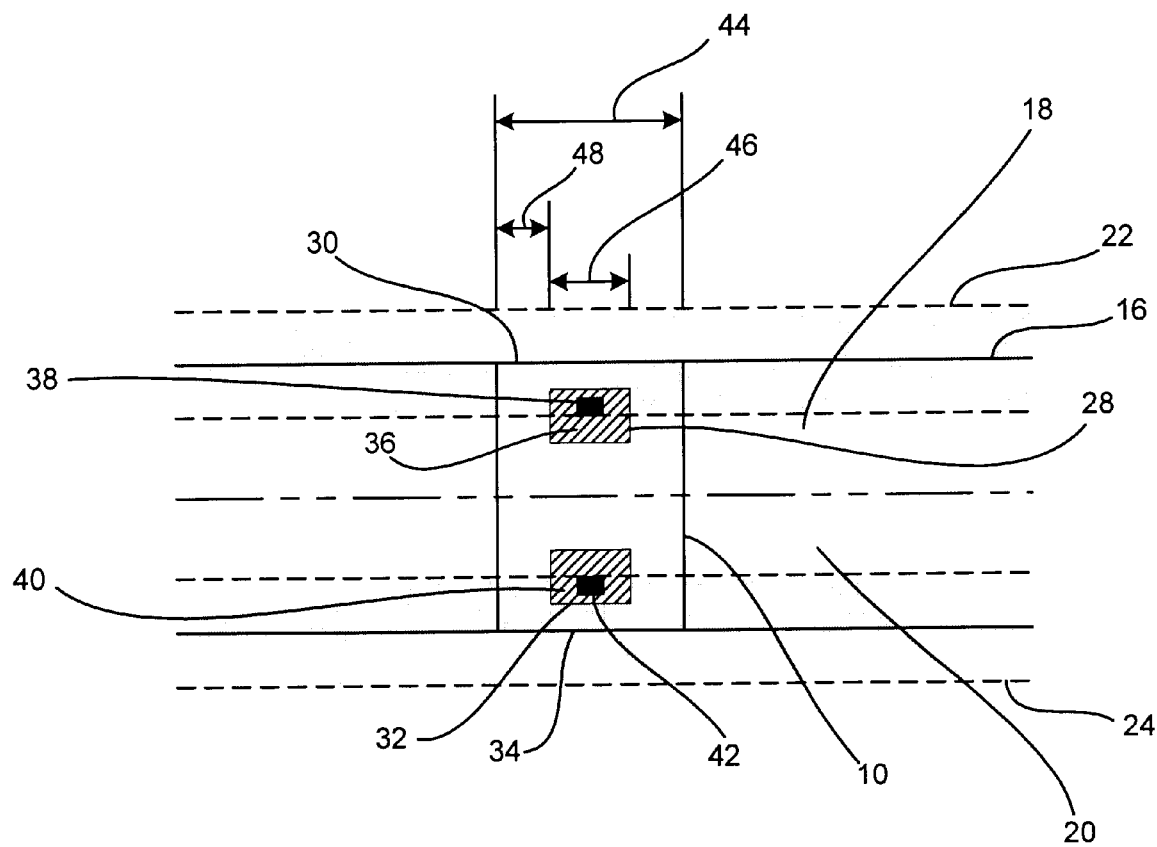
FIG. 2 is a plan view of a tap cell in accordance with the present invention; and, FIG. 3 is a flow chart that illustrates a method for positioning tap cells in an integrated circuit in accordance with the present invention.

Referring now to FIGS. 1 and 2, tap cells 10 are preferably, though not necessarily, positioned at equally spaced intervals 26 in alternating rows 16 of the integrated circuit 12. A well tap 28 is disposed near a first end 30 of each tap cell 10 and a substrate tap 32 is disposed near a second end 34 of each tap cell 10. Each well and substrate tap 28, 32 acts as a lead by which the well and substrate regions 18, 20 are coupled to the power and ground rails 22, 24 respectively. More particularly, each well tap 28 extends from a layer of the circuit 12 at which the well region 18 is disposed to a layer at which the power rail 22 is disposed. In addition, each well tap 28 is doped with a dopant that causes the well tap 28 to be electrically conductive so that the well region 18 is thereby electrically coupled to the power rail 22. Due to the nature of the doping process, the doping pattern is more diffused in an outer region 36 of the well tap 28 and becomes more concentrated and thus more conductive in an inner region 38 of the well tap 28. Similarly, each substrate tap 32 extends from a layer of the circuit 12 at which the substrate region 20 is disposed to a layer at which the ground rail 24 is disposed. In addition, each substrate tap 32 is doped with a dopant that causes the substrate tap 32 to be electrically conductive so that the substrate region 20 is thereby electrically coupled to the ground rail 24. Again, the doping process causes the doping pattern of the substrate tap 32 to be more diffused in an outer region 40 of the substrate tap 32 and more concentrated and thus more conductive in an inner region 42 of the substrate tap 32.

The interval 26, or distance between tap cells 10 does not exceed the maximum allowable distance obtained using the design rules (not shown) that are associated with the integrated circuit 12. Specifically, as described above, the design rules specify the maximum distance from any point in the substrate or well region to the nearest substrate or well tap, respectively. Further, the distance specified in the design rules is multiplied by a factor of two to obtain the maximum allowable distance between tap cells. Thus, in order to satisfy the design rules related to tap positioning and thereby prevent latch-up, every substrate region 20 is populated with a set of substrate taps 32 that are separated by an interval 26 that does not exceed the maximum allowable distance and every well region 18 is populated with a set of well taps 28 that are separated by an interval 26 that does not exceed the maximum allowable distance.

Although in many instances, the maximum allowable distance between substrate taps 32 will be equal to the maximum allowable distance between well taps 28, there may be instances in which the distances are not equal. When the distances are not equal, the length of the interval 26 must be designed so that it does not exceed the smaller of the two maximum allowable distances. In addition, because each well and substrate region 18, 20 is disposed in two adjacent rows 16, the tap cells 10 in which the well and substrate taps 28, 32 are disposed need only be located in every other row 16 to satisfy the design rules. Of course, the dimensions of the tap cells 10 will affect the length of the interval 26 separating the tap cells 10. For example, if the width 44 of the tap cell 10 exceeds the width 46 of the well or substrate tap 28, 32 disposed therein, then the length of the interval 26 must be reduced to take into account the distance 48 between the edge of the tap 28, 32 and the edge of the tap cell 10. Specifically, the length of the interval 26 plus the length of the distance 48 between the edge of the tap 28, 32 and the edge of the tap cell 10 must not exceed the maximum allowable distance. As will be appreciated by one having ordinary skill in the art, the exact positions at which the tap cells 10 are located may vary, provided that the intervals 26 do not exceed the maximum allowable distance. In addition, although the intervals 26 are preferably spaced at equal distances, the distance between the intervals 26 may vary provided, of course, that the largest distance between any two tap cells 10 does not exceed the maximum allowable distance associated with the integrated circuit. Further, FIG. 1 is only intended to provide sufficient detail to indicate the positions at which the tap cells 10 are located relative to each other and relative to the well and substrate regions 18, 20 and the power and ground rails 22, 24. As a result, only two of the plurality of logic cells 11 that are used to implement the desired logic of the integrated circuit 12 and that would typically be disposed in the portions of the rows 16 that are not occupied by the tap cells 10, are shown in FIG. 1.

Figure 3:
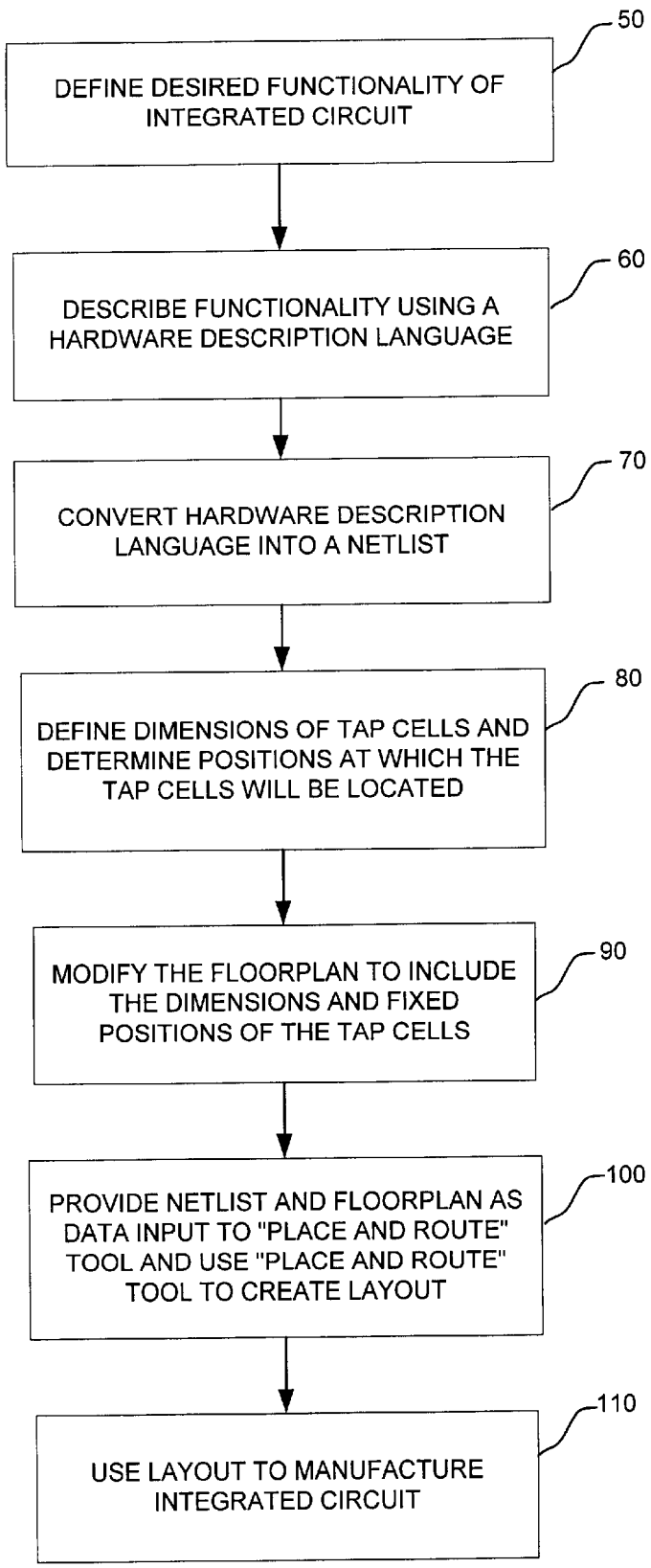

Referring now to FIG. 3, a flowchart illustrating a method of designing an integrated circuit that incorporates a set of steps for determining the positions at which a set of tap cells 10 will be located begins at a step 50 where the desired functionality of the integrated circuit 12 is defined. For example, if the integrated circuit 12 is going to be used as a microprocessor, then the desired functionality of the microprocessor is defined. If, instead the integrated circuit 12 is going to be used as an application specific integrated circuit (ASIC) then the desired functionality of the ASIC is defined. Next, at a step 60, the desired functionality of the integrated circuit 12 is described using a hardware description language such as, for example, Verilog or VHDL.

Continuing at a step 70, the hardware description language is converted into a netlist using any of a number of synthesis tools such as, for example, Design Compiler by Synopsys® or Build Gates by Cadence®. As described above, the netlist is a listing of the logic gates, the connections between the gates, wiring and input/output ports required to implement the functionality of the integrated circuit as described in the hardware description language. In particular, each of the logic gates required to implement the integrated circuit is represented in the netlist by a logic cell which defines the circuitry required to implement the logic gate. As described above, the logic cells listed in the netlist may be standard library cells or may instead be customized cells having application-specific functions. Also, at the step 70, the netlist version of the integrated circuit design may be used to perform computer simulations to test the integrated circuit design for defects.

Next, at a step 80, the dimensions of a set of tap cells 10 are defined and a set of positions at which the tap cells will be located in the placeable area 14 of the integrated circuit 12 are determined. More particularly, a floorplan associated with the integrated circuit is used to provide the physical dimensions of the basic structure of the integrated circuit. As will be understood by one having ordinary skill in the art, the floorplan defines the physical constraints of the integrated circuit, including, for example, the location of a power grid, the location of input/output ports, the dimensions of the integrated circuit block and the areas of the integrated circuit in which wires associated with the power grid and other pre-existing circuitry are disposed. Specifically, the designer obtains the orientation, number and dimensions of the rows 16 of the integrated circuit 12 in which the logic cells 11 and tap cells 10 will be located. In addition, the designer obtains the maximum allowable distance between tap cells 10 from the design rules associated with the integrated circuit 12 and defines the dimensions of the tap cells 10. Using the row information, the tap cell dimensions and the maximum allowable distance, the designer calculates the number of tap cells 10 that will be placed in each row 16 and the length of the interval 26 that will be interposed between each tap cell 10 located in a row 16 such that the positions of the tap cells 10 are located at equally spaced intervals 26 and such that the interval 26 between the tap cells 10 located in a given row 16 does not exceed the maximum allowable distance. Of course, as described above, the designer must take into account the distance 48 between the edge of the tap 28 or 32 and the edge of the tap cell 10 when determining the length of the interval 26.

Once the dimensions and positions of the tap cells 10 have been defined, at a step 90, the floorplan associated with the integrated circuit design is modified to include the dimensions and positions of the tap cells 10 at a step 90. Typically, the floorplan exists in a computer file format written in a physical netlist syntax such as Design Exchange Format ("DEF") by Cadence® that is easily modifiable to include the dimensions and positions of the tap cells 10. After the netlist version of the integrated circuit 12 has been completely tested and debugged, at the step 70, and after the floorplan has been modified to include the dimensions/positions of the tap cells, at the step 90, the netlist and the floorplan are provided as data input to a computer-automated design tool referred to as a "place and route" tool such as, Silicon Ensemble by Cadence®, at a step 100. The "place and route" tool then uses the netlist and the floorplan to design a layout for the integrated circuit 12. As will be understood by one having ordinary skill in the art, the layout is a representation of the integrated circuit 12 that includes the physical dimensions and configuration of the integrated circuit components and serves as a blueprint from which the integrated circuit 12 may be manufactured. For example, the "place and route" tool determines where the logic cells listed in the netlist are to be located in the placeable area 14 of the integrated circuit 12 and further determines the routing of any wires needed to support the logic cells. In addition, the "place and route" tool automatically incorporates the information provided in the floorplan such that the resulting layout incorporates the positions at which the tap cells 10 are located.

Finally, at a step 110, the layout may be used to manufacture the desired integrated circuit. As will be appreciated by one having ordinary skill in the art, the step 70 of determining positions where the tap cells 10 will be located may be done before, during or after the step 60 of converting the hardware description language into the netlist. In addition, the design method of FIG. 3 is not limited to design processes that use a "place and route" tool. In fact, any layout tool may be used to create the integrated circuit layout. In addition, the layout may even be created using a process that includes steps that are performed manually by a designer who, for example, incorporates the positions of the tap cells determined at the step 80.

From the foregoing description, it should be understood that an improved integrated circuit with tap cells fixed at equally spaced intervals and a method for positioning the tap cells in the integrated circuit have been shown and described, both of which have many desirable attributes and advantages. The integrated circuit having tap cells fixed at equally spaced intervals is less costly to design and the method of designing integrated circuits that include tap cells located at equally space intervals will eliminate the need to place well and substrate taps into each and every library cell, thereby potentially reducing library cell dimensions. Moreover, the method of determining the positions at which the tap cells shall be located is compatible with existing design processes, including design processes that use a computerized layout tool such as a "place and route" tool.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

What is claimed is:

1. An integrated circuit comprising:
    a set of logic cells configured and adapted to cause the integrated circuit to perform a set of desired functions; and
    a plurality of tap cells, each tap cell including at least one of a well tap and a substrate tap, wherein said tap cells are fixed at intervals before disposing said logic cells, and further wherein said intervals do not exceed a maximum allowable distance.

2. The integrated circuit as defined in claim 1 wherein said intervals are generally equally spaced.

3. The integrated circuit as defined in claim 1 wherein each tap cell comprises a well tap and a substrate tap, said well tap being disposed in a well region of said tap cell and said substrate tap being disposed in a substrate region of said tap cell.

4. The integrated circuit as defined in claim 1 wherein said integrated circuit is partitioned into a set of rows and further wherein said tap cells are located in alternating rows.

5. The integrated circuit as defined in claim 4 wherein said logic cells are disposed in said rows, and further wherein said logic cells disposed in said alternating rows with said tap cells are located in said intervals between said tap cells.

6. The integrated circuit as defined in claim 1 wherein said maximum allowable distance is obtained using a set of design rules associated with said integrated circuit.

7. The integrated circuit as defined in claim 1 wherein said integrated circuit is a CMOS integrated circuit.

8. An integrated circuit comprising:
    a placeable area that is partitioned into a set of rows;
    a plurality of tap cells disposed in alternating rows of said placeable area, wherein each tap cell includes at least one of a well tap and a substrate tap, and wherein said tap cells are fixed at intervals in said alternating rows, and further wherein said intervals do not exceed a maximum allowable distance;
    a plurality of logic cells disposed in said rows of said placeable area after the disposal of said plurality of tap cells, wherein said logic cells are adapted to cause said integrated circuit to perform a set of desired functions, and wherein said logic cells disposed in said alternating rows with said tap cells are positioned in said intervals between said tap cells.

9. The integrated circuit as defined in claim 8 wherein said intervals are generally equally spaced.

10. The integrated circuit as defined in claim 8 wherein said maximum allowable distance is obtained using a set of design rules associated with said integrated circuit.

11. The integrated circuit as defined in claim 8 wherein said integrated circuit is a CMOS integrated circuit.

12. A method for designing an integrated circuit, comprising the steps of:
    determining a set of positions at which a set of tap cells will be fixed in said integrated circuit, wherein each of said tap cells includes at least one of a well tap and a substrate tap, and wherein said positions are located at intervals, and further wherein said intervals do not exceed a maximum allowable distance;
    providing said positions as data input to a place and route tool; and,
    using said place and route tool to create a layout for said integrated circuit, wherein said layout incorporates said positions at which said tap cells will be fixed before a placement of logic cells.

13. The method as defined in claim 12 wherein said intervals are generally equally spaced.

14. The method as defined in claim 12 wherein said integrated circuit is partitioned into a set of rows and wherein said positions are located in alternating rows.

15. The method as defined in claim 12 wherein said step of providing said positions as data input to a place and route tool further comprises the steps of:
    modifying a floorplan associated with said integrated circuit to incorporate said positions at which said tap cells will be fixed; and,
    providing said floorplan as data input to said place and route tool.

16. The method as defined in claim 15 wherein said floorplan comprises a set of physical constraints associated with said integrated circuit.

17. The method as defined in claim 12 wherein said step of using said place and route tool to create said layout further comprises the steps of:
    providing a list of logic cells as data input to said place and route tool, wherein said logic cells are adapted to cause said integrated circuit to perform a set of desired functions; and, causing said place and route tool to incorporate said logic cells into said layout.

18. The method as defined in claim 17 wherein said integrated circuit is partitioned into a set of rows, and wherein said positions at which said tap cells will be fixed are disposed in alternating rows.

* * * * *